(12) United States Patent
Lee et al.

(10) Patent No.: US 11,088,279 B2
(45) Date of Patent: Aug. 10, 2021

(54) CHANNEL STRAIN FORMATION IN VERTICAL TRANSPORT FETS WITH DUMMY STRESSOR MATERIALS

(71) Applicant: International Business Machines Corporation, Armonk, NY (US)

(72) Inventors: Choonghyun Lee, Rensselaer, NY (US); Kangguo Cheng, Schenectady, NY (US); Shogo Mochizuki, Clifton Park, NY (US); Juntao Li, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/783,011

(22) Filed: Feb. 5, 2020

(65) Prior Publication Data

US 2020/0176333 A1 Jun. 4, 2020

Related U.S. Application Data

(62) Division of application No. 15/986,622, filed on May 22, 2018, now Pat. No. 10,600,695.

(51) Int. Cl.
*H01L 29/76* (2006.01)
*H01L 29/78* (2006.01)
(Continued)

(52) U.S. Cl.
CPC ...... *H01L 29/7827* (2013.01); *H01L 21/0217* (2013.01); *H01L 21/8238* (2013.01);
(Continued)

(58) Field of Classification Search
CPC ........... H01L 29/66666; H01L 29/6653; H01L 29/7847; H01L 29/66545; H01L 29/7843;
(Continued)

(56) References Cited

U.S. PATENT DOCUMENTS 6,974,981 B2* 12/2005 Chidambarrao .. H01L 21/76232
257/265
7,683,428 B2 3/2010 Chidambarrao et al.
(Continued)

OTHER PUBLICATIONS

Fang et al., "SAQP Pitch walk metrology using single target metrology," Proc. of SPIE, vol. 10145 (Mar. 2017) (7 total pages).
(Continued)

*Primary Examiner* — Shouxiang Hu
(74) *Attorney, Agent, or Firm* — Randall Bluestone; Michael J. Chang, LLC (57) ABSTRACT

Techniques for forming VTFET devices with tensile- and compressively-strained channels using dummy stressor materials are provided. In one aspect, a method of forming a VTFET device includes: patterning fins in a wafer; forming bottom source and drains at a base of the fins; forming bottom spacers on the bottom source and drains; growing at least one dummy stressor material along sidewalls of the fins above the bottom spacers configured to induce strain in the fins; surrounding the fins with a rigid fill material; removing the at least one dummy stressor material to form gate trenches in the rigid fill material while maintaining the strain in the fins by the rigid fill material; forming replacement gate stacks in the gate trenches; forming top spacers on the replacement gate stacks; and forming top source and drains over the top spacers at tops of the fins. A VTFET device is also provided.

20 Claims, 9 Drawing Sheets

(51) Int. Cl.
*H01L 21/8238* (2006.01)
*H01L 27/092* (2006.01)
*H01L 29/66* (2006.01)
*H01L 29/51* (2006.01)
*H01L 21/8234* (2006.01)
*H01L 21/02* (2006.01)
*H01L 27/108* (2006.01)

(52) U.S. Cl.
CPC ........... *H01L 21/823487* (2013.01); *H01L 21/823807* (2013.01); *H01L 21/823821* (2013.01); *H01L 21/823885* (2013.01); *H01L 27/092* (2013.01); *H01L 27/0924* (2013.01); *H01L 27/10826* (2013.01); *H01L 29/513* (2013.01); *H01L 29/6653* (2013.01); *H01L 29/66545* (2013.01); *H01L 29/66795* (2013.01); *H01L 29/7843* (2013.01); *H01L 29/7847* (2013.01)

(58) Field of Classification Search
CPC ........ H01L 29/42392; H01L 29/66553; H01L 21/823885; H01L 27/10826; H01L 27/0924; H01L 29/66795; H01L 21/823487; H01L 21/823821; H01L 21/0217; H01L 21/8238; H01L 29/7827; H01L 27/092; H01L 29/513; H01L 21/823807; H01L 21/823828; H01L 21/823842; H01L 29/78642

See application file for complete search history.

(56) References Cited

U.S. PATENT DOCUMENTS

| | | | |
|---|---|---|---|
| 7,749,842 | B2 | 7/2010 | Zhu et al. |
| 9,087,897 | B1 | 7/2015 | Anderson et al. |
| 9,466,668 | B2 | 10/2016 | Colinge et al. |
| 9,698,266 | B1 | 7/2017 | Cheng et al. |
| 9,704,990 | B1 | 7/2017 | Mochizuki et al. |
| 9,755,073 | B1 | 9/2017 | Cheng et al. |
| 9,793,401 | B1 | 10/2017 | Balakrishnan et al. |
| 10,497,719 | B2 * | 12/2019 | Hong ............ H01L 29/78654 |
| 2008/0173942 | A1 | 7/2008 | Zhu et al. |
| 2014/0008736 | A1 | 1/2014 | Li et al. |
| 2016/0190304 | A1 | 6/2016 | Morin et al. |
| 2017/0229556 | A1 | 8/2017 | Anderson et al. |
| 2018/0047845 | A1 | 2/2018 | Cheng et al. |

OTHER PUBLICATIONS

List of IBM Patents or Applications Treated as Related (2 pages).

* cited by examiner

CHANNEL STRAIN FORMATION IN VERTICAL TRANSPORT FETS WITH DUMMY STRESSOR MATERIALS

CROSS-REFERENCE TO RELATED APPLICATIONS

This application is a divisional of U.S. application Ser. No. 15/986,622 filed on May 22, 2018, now U.S. Pat. No. 10,600,695, the contents of which are incorporated by reference herein.

FIELD OF THE INVENTION

The present invention relates to vertical transport field-effect transistor (VTFET) devices, and more particularly, to techniques for forming VTFET devices with tensile- and compressively-strained channels using dummy stressor materials.

BACKGROUND OF THE INVENTION

Vertical transport field-effect transistor (VTFET) devices have potential advantages over conventional FinFETs in terms of density, power consumption, and integration. However, the lack of strain in the channel of VTFET devices makes it difficult to compete with other device options in terms of performance.

Forming channel strain in VTFET devices is extremely challenging. The challenge is due to the free-standing fin channel-based structure of the VTFET devices which makes controlling strain in the vertical fin channel difficult.

Accordingly, techniques for forming (compressive and tensile) strain in VTFET devices would be desirable.

SUMMARY OF THE INVENTION

The present invention provides techniques for forming vertical transport field-effect transistor (VTFET) devices with tensile- and compressively-strained channels using dummy stressor materials. In one aspect of the invention, a method of forming a VTFET device is provided. The method includes: patterning fins in a wafer; forming bottom source and drains at a base of the fins; forming bottom spacers on the bottom source and drains; growing at least one dummy stressor material along sidewalls of the fins above the bottom spacers configured to induce strain in the fins; surrounding the fins with a rigid fill material; removing the at least one dummy stressor material to form gate trenches in the rigid fill material while maintaining the strain in the fins by the rigid fill material; forming replacement gate stacks in the gate trenches; forming top spacers on the replacement gate stacks; and forming top source and drains over the top spacers at tops of the fins.

In another aspect of the invention, a VTFET device is provided. The VTFET device includes: fins patterned in a wafer; bottom source and drains at a base of the fins; bottom spacers on the bottom source and drains; gate stacks along sidewalls of the fins above the bottom spacers, wherein strain is present in the fins; a rigid fill material surrounding the fins and the gate stacks; top spacers on the replacement gate stacks; and top source and drains over the top spacers at tops of the fins.

A more complete understanding of the present invention, as well as further features and advantages of the present invention, will be obtained by reference to the following detailed description and drawings.

DETAILED DESCRIPTION OF PREFERRED EMBODIMENTS

Channel strain can enhance field-effect transistor (FET) device performance. For instance, compressive channel strain in p-channel FET (pFET) devices increases the hole mobility, whereas tensile channel strain in n-channel FET (nFET) devices increases electron mobility. However, due to the free-standing nature of the fin channel of a vertical transport field-effect transistor (VTFET) device, forming channel strain is difficult. Namely, as opposed to planar complementary metal-oxide-semiconductor (CMOS) devices, VTFET devices are oriented with a vertical fin channel disposed on a bottom source/drain and a top source/drain disposed on the fin channel.

Advantageously, provided herein are techniques for forming (compressive and tensile) channel strain in VTFET devices which improves the electron and hole mobility. As will be described in detail below, dummy stressor materials (which also double as a dummy gate) are used to induce strain in the vertical fin channel, and a rigid material is used at the fin edge to preserve the strain after the dummy stressor materials are removed. The term "dummy" material as used herein refers to a sacrificial material that is placed for a given purpose at one point in the process, and then later removed. A dummy gate is employed in a gate-last process where processing conditions such as elevated temperatures can damage the gate stack materials. For instance, high-κ metal gate stack materials are particularly susceptible to damage from the high temperatures often employed during dopant drive-in and activation anneals. Thus, a dummy gate can be employed early on in the process to permit formation of the source and drains, etc. and all associated high-temperature processing to be performed. At the end of the process, the dummy gates are removed and replaced with a 'replacement' metal gate. This process may also be referred to herein as a replacement metal gate or RMG process. Similarly, the dummy (gate/stressor) material will be used to induce strain in the vertical fin channel, which is then retained using a rigid material at the fins edge, after which, dummy/sacrificial stressor material is removed.

Figure 1:
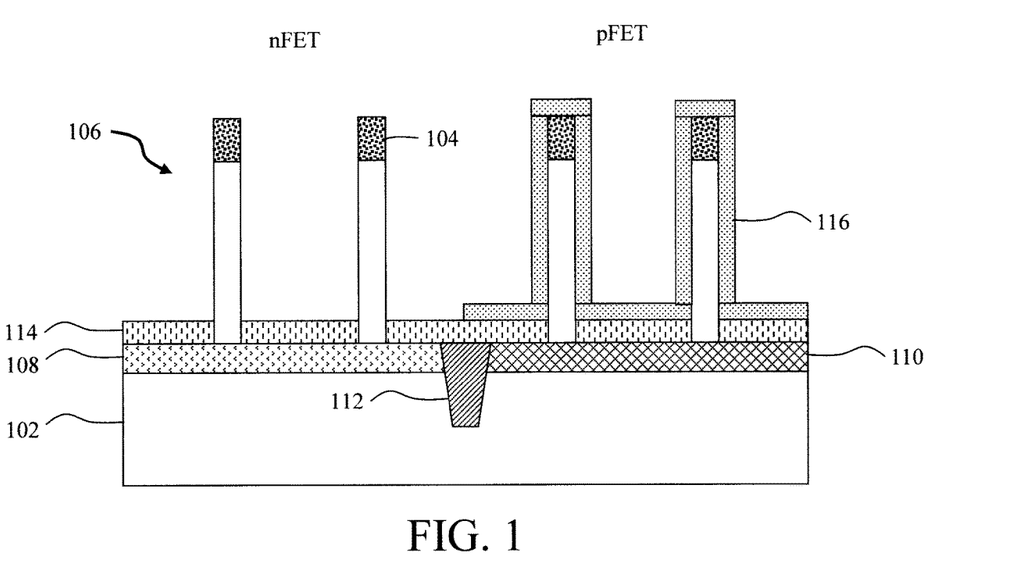
FIG. 1 is a cross-sectional diagram illustrating fin hardmasks having been used to pattern a plurality of (nFET/pFET) fins in a wafer, (nFET/pFET) bottom source and drains having been formed at the base of the nFET and pFET fins, bottom spacers having been formed on the nFET and pFET bottom source and drains, and a (first) liner having been formed covering the pFET fins according to an embodiment of the present invention.
Figure 2:
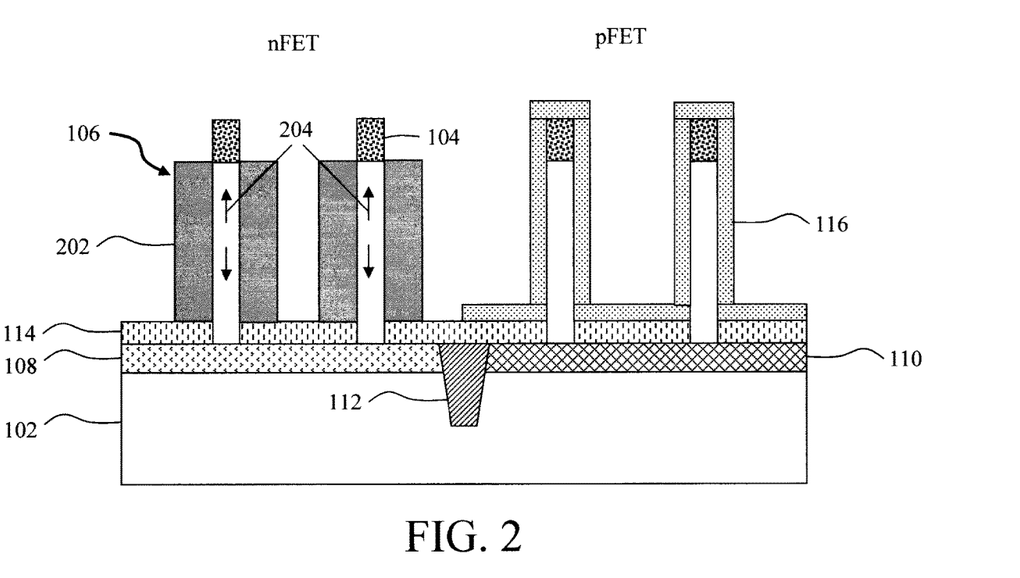
FIG. 2 is a cross-sectional diagram illustrating a dummy (tensile) stressor material having been grown on sidewalls of the nFET fins above the bottom spacers according to an embodiment of the present invention.

An exemplary methodology for forming a VTFET device in accordance with the present techniques is now described by way of reference to FIGS. 1-15. As shown in FIG. 1, the process begins with patterning a plurality of fins 106 in a wafer 102. According to an exemplary embodiment, wafer 102 is a bulk semiconductor wafer, such as a bulk silicon (Si), bulk germanium (Ge), bulk silicon germanium (SiGe) and/or bulk III-V semiconductor wafer. Alternatively, wafer 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

To pattern the fins 106, a plurality of fin hardmasks 104 are patterned on the substrate 102 marking the footprint and location of the fins 106. Suitable hardmask materials include, but are not limited to, nitride materials such as silicon nitride (SiN) and/or silicon oxynitride (SiON). Any suitable lithography and etching technique may be used to pattern the fin hardmasks 104. For instance, direct patterning or sidewall image transfer (SIT) process may be employed. Advantageously, SIT (also referred to as self-aligned double patterning (SADP)) can be used to pattern fins at a sub-lithographic pitch, i.e., a pitch smaller than what is achievable using direct lithographic patterning. A process wherein the SIT steps are repeated is referred to as self-aligned quadruple patterning (SAQP). The SAQP process is described, for example, in Fang et al., "SAQP Pitch walk metrology using single target metrology," Proc. of SPIE, vol. 10145 (March 2017) (7 total pages), the contents of which are incorporated by reference as if fully set forth herein. A directional (anisotropic) etching process such as reactive ion etching (RIE) is then used to pattern the fins 106 in the wafer 102 using the fin hardmasks 104.

As shown in FIG. 1, one or more of fins 106 will serve as the vertical fin channels for an nFET device(s) and another one or more of fins 106 will serve as the vertical fin channels for a pFET device(s). As provided above, it is desirable to have a tensile channel strain in nFET devices for enhanced electron mobility, and compressive strain in pFET devices for enhanced hole mobility. To illustrate the effectiveness of present techniques for inducing both tensile and compressive channel strain, in the present example both nFET and pFET VTFET devices will be formed concurrently on the same wafer. However, the same processes described herein can be implemented to form only nFET or pFET VTFET devices, if so desired.

Bottom source and drains 108 and 110 are formed at the base of the nFET and pFET fins 106, respectively. According to an exemplary embodiment, the bottom source and drains 108 and 110 are formed from an in-situ doped (e.g., during growth) or ex-situ doped (e.g., by ion implantation) epitaxial material. By way of example only, suitable source and drain materials for the nFET bottom source and drains 108 include, but are not limited to, phosphorous-doped Si (Si:P). Suitable materials for the pFET bottom source and drains 110 include, but are not limited to, boron-doped SiGe (SiGe:B).

To isolate the nFET bottom source and drains 108 from the pFET bottom source and drains 110, a shallow trench isolation (STI) region 112 is formed in the wafer 102. In general, STI involves patterning a trench in the wafer 102 and then filling the trench with an insulator such as an oxide (also referred to herein as an "STI oxide").

Bottom spacers 114 are then formed on the bottom source and drains 108 and 110. See FIG. 1. Suitable materials for the bottom spacers 114 include, but are not limited to, oxide spacer materials such as $SiO_2$ and/or silicon oxycarbide (SiOC) and/or nitride spacer materials such as SiN and/or silicon-boron-nitride (SiBN). The bottom spacers 114 will serve to offset the gates of the device (see below) from the bottom source and drains 108 and 110.

According to an exemplary embodiment, the bottom spacers 114 are formed using a directional deposition process whereby the spacer material is deposited onto the bottom source and drains 108 and 110 and fins 106 with a greater amount of the material being deposited on horizontal surfaces (including on top of the bottom source and drains 108 and 110 in between the fins 106), as compared to vertical surfaces (such as alongside the fins 106). Thus, when an etch is used on the spacer material, the timing of the etch needed to remove the spacer material from the vertical surfaces will leave the bottom spacers 114 shown in FIG. 1 on the bottom source and drains 108 and 110 since a greater amount of the spacer material was deposited on the bottom source and drains 108 and 110. By way of example only, a high density plasma (HDP) CVD or physical vapor deposition (PVD) process can be used for directional film deposition, and an oxide- or nitride-selective (depending on the spacer material) isotropic etch can be used to remove the (thinner) spacer material deposited onto the vertical surfaces.

As will be described in detail below, the process for inducing channel strain will involve protecting the fins of one device while a dummy/sacrificial stressor material is grown on the other, and then reversing the process to grow a different dummy stressor material on the fins of the other device. In the present example, the dummy stressor material will arbitrarily be grown on nFET fins 106 first. The pFET fins 106 to be protected during this process. To do so, a liner 116 is formed covering the pFET fins 106. According to an exemplary embodiment, placement of the liner 116 over the pFET fins 106 can be accomplished by first blanket depositing the liner 116 over all of the (nFET and pFET) fins 106, masking the liner 116 over the pFET fins 106 (e.g., using a standard block mask—not shown) and then etching/removing the liner 116 from the nFET fins. As such, liner 116 needs to be formed from a material that can be etched selective to the bottom spacers 114. By way of example only, when the bottom spacers 114 are formed from an oxide material (e.g., $SiO_2$ and/or SiOC) then the liner 116 can be formed from a nitride material (e.g., SiN and/or SiBN). Conversely, when the bottom spacers 114 are formed from a nitride material (e.g., SiN and/or SiBN) then the liner 116 can be formed from an oxide material (e.g., $SiO_2$ and/or SiOC).

With the liner 116 in place over/protecting the pFET fins 106, a dummy (tensile) stressor material 202 is grown on sidewalls of the nFET fins 106 above the bottom spacers 114. See FIG. 2. To induce tensile strain in the nFET fins 106, the dummy stressor material 202 generally should have a greater lattice constant than the fins 106. Preferably, the dummy stressor material 202 has a lattice constant of from about 1% to about 2%, and ranges therebetween, greater than the lattice constant of the fins 106. For instance, according to an exemplary embodiment, the wafer 102/fins 106 are Si. In that case, a suitable dummy stressor material 202 is epitaxial SiGe grown on the exposed sidewalls of the nFET fins 106 which (having a lattice constant that is from about 1% to about 2%, and ranges therebetween, greater than Si) will apply tensile strain to the nFET fins 106. Preferably, the epitaxial SiGe, when used as dummy stressor material 202, has a germanium (Ge) percentage of less than about 20% to avoid forming defects. Other materials having a greater lattice constant than Si include, but are not limited to, epitaxial III-V materials (i.e., materials containing at least one Group III element and at least one Group V element from the periodic table). As shown by arrows 204 in FIG. 2, the dummy stressor material 202 induces tensile strain in the nFET fins 106.

Figure 3:
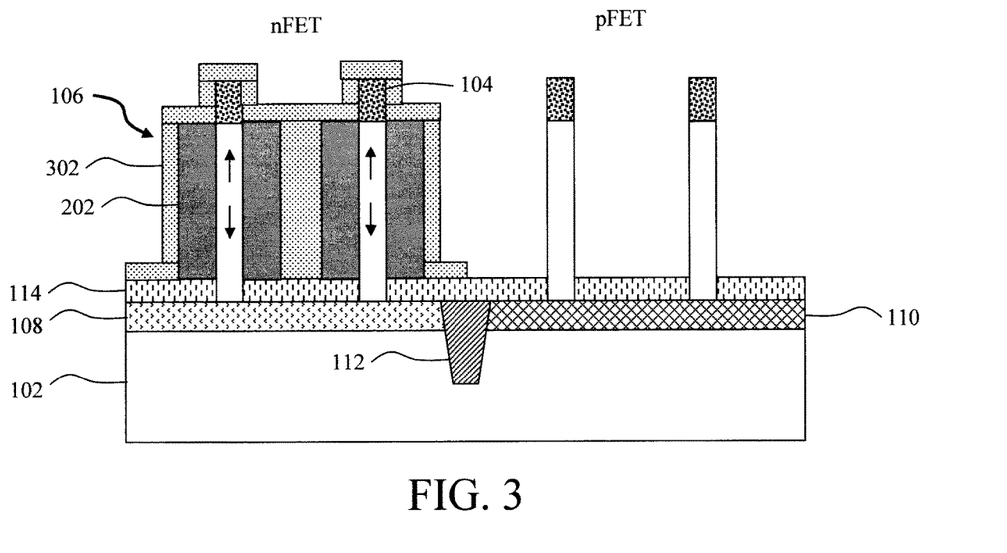
FIG. 3 is a cross-sectional diagram illustrating the first liner having been removed from the pFET fins, and a (second) liner having been formed covering the tensile dummy stressor material on the nFET fins according to an embodiment of the present invention.

Following formation of the dummy stressor material 202 on the nFET fins 106, the liner 116 is removed from the pFET fins 106. The process is then repeated for the pFET fins 106 except a compressive dummy stressor material is used. For instance, as shown in FIG. 3, a liner 302 is formed covering the dummy stressor material 202 on nFET fins 106. The requirements for the liner 302 are the same as that of liner 116 (i.e., liner 302 needs to be selectively etched vis-à-vis the bottom spacers 114). Suitable liner materials that provide this etch selectivity were provided above. According to an exemplary embodiment, the liner 302 is formed from the same material as liner 116. Further, as described above, the liner 302 can be formed selectively covering the dummy stressor material 202 on nFET fins 106 by first blanket depositing the liner 302 over all of the (nFET and pFET) fins 106, masking the liner 302 over the dummy stressor material 202 on the nFET fins 106 (e.g., using a standard block mask—not shown) and then etching/removing the liner 302 from the pFET fins.

With the liner 302 in place over/protecting the dummy stressor material 202 on the nFET fins 106, a different (compressive) dummy stressor material 402 is then grown on the exposed sidewalls of the pFET fins 106 above the bottom spacers 114. See FIG. 4. To induce compressive strain in the pFET fins 106, the dummy stressor material 402 generally should have a smaller lattice constant than the fins 106. Preferably, the dummy stressor material 402 has a lattice constant of from about 1% to about 2%, and ranges therebetween, less than the lattice constant of the fins 106. For instance, according to an exemplary embodiment, the wafer 102/fins 106 are Si. In that case, a suitable dummy stressor material 402 is epitaxial silicon carbide (SiC) grown on the exposed sidewalls of the pFET fins 106 which (having a lattice constant that is from about 1% to about 2%, and ranges therebetween, less than Si) will apply compressive strain to the pFET fins 106. Preferably, the epitaxial SiC, when used as dummy stressor material 402, has a carbon (C) percentage of less than about 2% to avoid forming defects. As shown by arrows 404 in FIG. 4, the dummy stressor material 402 induces compressive strain in the pFET fins 106. Following formation of the dummy stressor material 402 on the pFET fins 106, the liner 302 is removed from the nFET fins 106.

Figure 4:
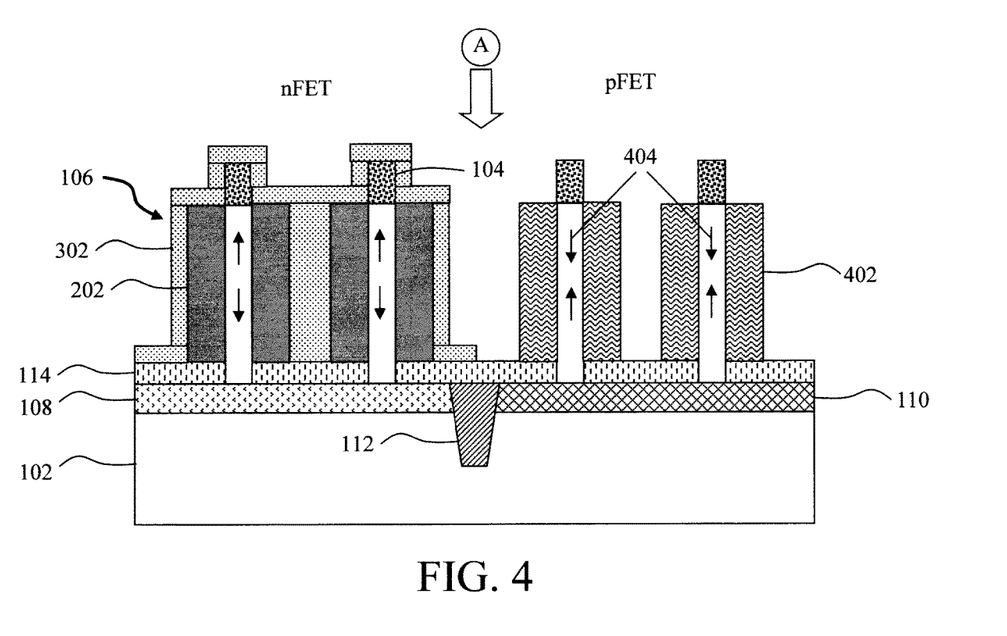
FIG. 4 is a cross-sectional diagram illustrating a (compressive) dummy stressor material having been grown on the exposed sidewalls of the pFET fins above the bottom spacers according to an embodiment of the present invention.

A fin cut can next be performed to divide the fins 106 into sections corresponding to individual nFET and pFET devices. Namely, the process begins (as shown in FIG. 1) with patterning what is often referred to as a 'sea of fins' in the wafer 102. Cuts are then made along the length of the fins to create multiple sections, each of which corresponds to an nFET or pFET device. To best illustrate the fin cut process, reference shifts in FIG. 5 to a top-down view of the device structure (e.g., from viewpoint A—see FIG. 4). To look at it another way, the cross-sectional view provided in FIG. 4 is that of a cut along line A-A' in FIG. 5.

Figure 5:
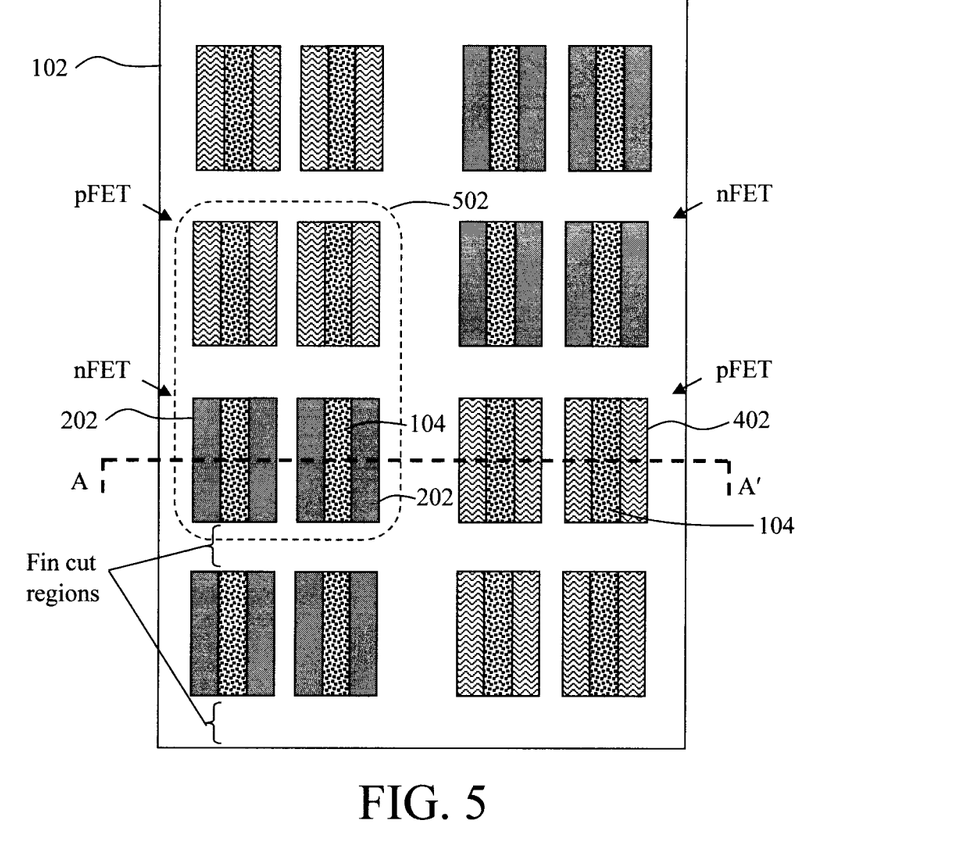
FIG. 5 is a top-down diagram illustrating a fin cut having been performed to remove portions of the fins from fin-cut regions dividing the fins into individual nFET and pFET devices according to an embodiment of the present invention.

As shown in FIG. 5, portions of the fins 106 are removed from fin-cut regions dividing the fins 106 into individual nFET and pFET devices. It is notable that, from a top-down perspective, the fins 106 themselves are not visible. However, the individual fin hardmasks 104 can be seen, each of which corresponds to a fin 106 below. As shown in FIG. 5, the fins 106 are cut on both ends of each individual device. This is notable since the strain imparted by the dummy stressor materials 202/402 will be locked in (i.e., maintained) using a rigid fill material (see below) which is deposited around the fins 106 (and particularly in direct contact with the ends of the fins 106 in the fins cut regions). That way, when the dummy stressor materials 202/402 are removed, the rigid fill material will prevent relaxation of the strain.

Another notable feature illustrated in FIG. 5 is that individual devices can be configured on the wafer 102 with one type of device (nFET or pFET) arranged in front of/behind the other. For instance, for the devices highlighted with dashed box 502, the two adjacent devices along the line A-A' are nFET devices (i.e., having nFET bottom/top source and drains and tensile stressor material), whereas the other two devices in dashed box 502 are pFET devices (i.e., having pFET bottom/top source and drains and compressive stressor material). The opposite orientation is present in the devices to the right of dashed box 502, and so on.

It is further notable that, despite the fins 106 being cut in the fin cut regions, the channel strain remains present via the dummy stressor materials 202/402 along the sidewalls of the fins 106. Later, a rigid material will be deposited surrounding the fins (including at the ends of the fins in the fin cut regions) to hold the stress, allowing the dummy stressor materials 202/402 to be removed.

Figure 6:
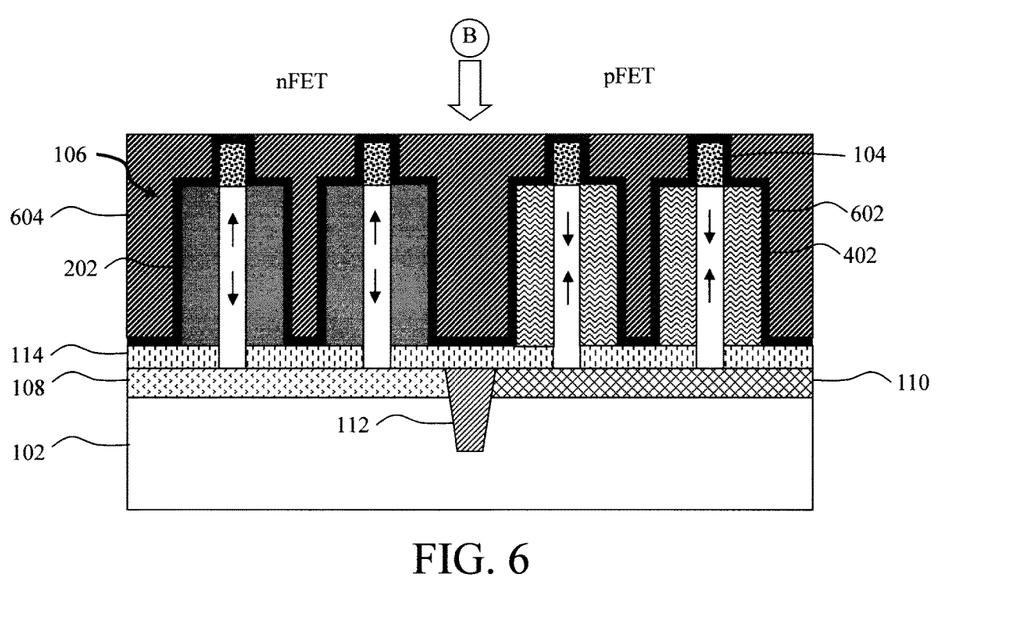
FIG. 6 is a cross-sectional diagram illustrating a thin liner having been deposited onto the fins, over the tensile/compressive dummy stressor materials, and a rigid fill material having been deposited over the liner, surrounding the fins according to an embodiment of the present invention.

Prior to placing the rigid material, a thin protective liner 602 is first deposited onto the fins 106, over the dummy stressor materials 202/402 and fin hardmasks 104, and onto the bottom spacers 114. The liner 602 serves as a barrier between the fins 106 and the rigid material to avoid any possible charging effects as well as undesirable reaction. According to an exemplary embodiment, the protective liner 602 is formed by depositing a suitable liner material using a conformal deposition process such as a chemical vapor deposition (CVD) or atomic layer deposition (ALD) to a thickness of from about 1 nanometer (nm) to about 4 nm, and ranges therebetween. Suitable materials for the protective liner 602 include, but are not limited to, oxide materials such as silicon dioxide ($SiO_2$) and/or silicon oxycarbide (SiOC).

Next, a rigid fill material 604 is deposited over the protective liner 602, surrounding the fins 106. See FIG. 6. Suitable rigid fill materials include, but are not limited to, nitride materials such as silicon nitride (SiN) and/or silicon oxycarbonitride (SiOCN). According to an exemplary embodiment, the rigid fill material 604 is deposited using CVD or ALD, filling the spaces between the fins 106. Excess rigid fill material 604 is then removed down to the protective liner 602 using a process such as chemical-mechanical polishing (CMP). By "rigid" it is meant that material 604 is stiff enough to securely anchor the ends of the fins 106 and prevents relaxation of the strain when the dummy stressor materials 202/402 are later removed. For instance, a material such as $SiO_2$ is too flexible to be used as a stress anchor, while SiN and/or SiOCN are preferred for their functionality.

Figure 7:
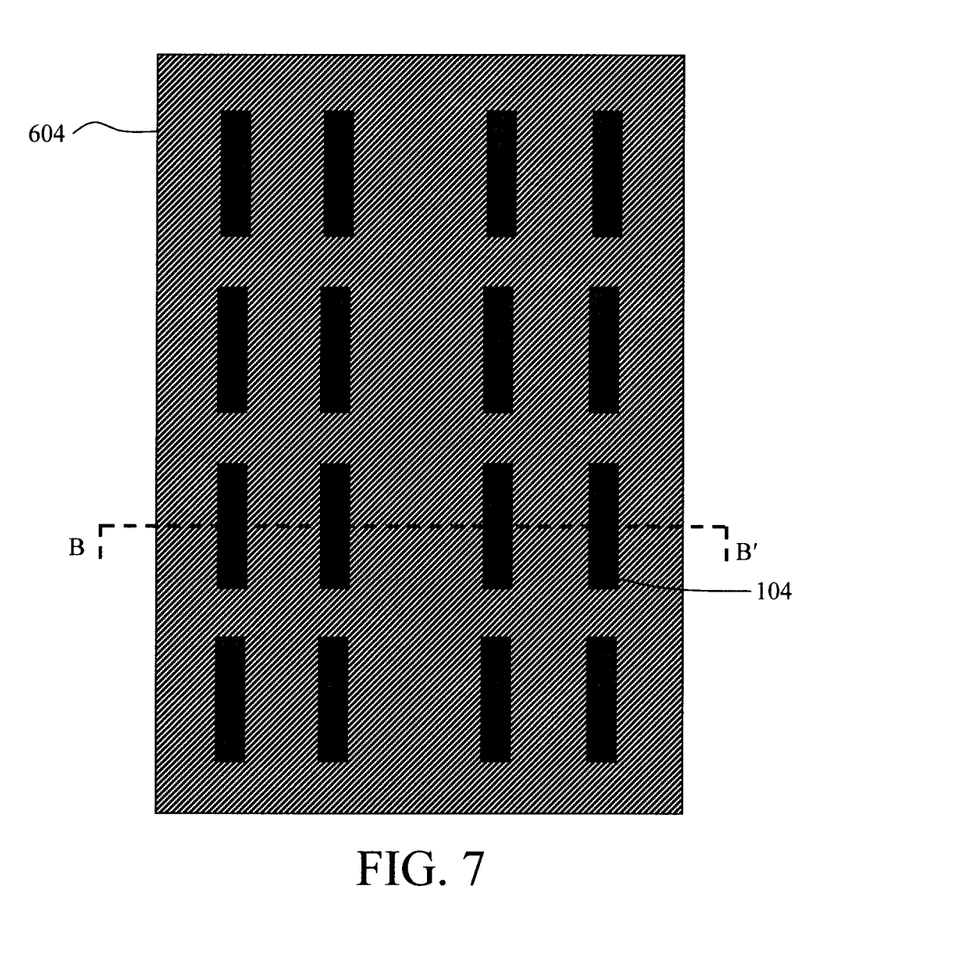
FIG. 7 is a top-down diagram illustrating how the rigid fill material is present surrounding the fins, and is in direct physical contact with the ends of the fins in the fin cut regions according to an embodiment of the present invention.
Figure 8:
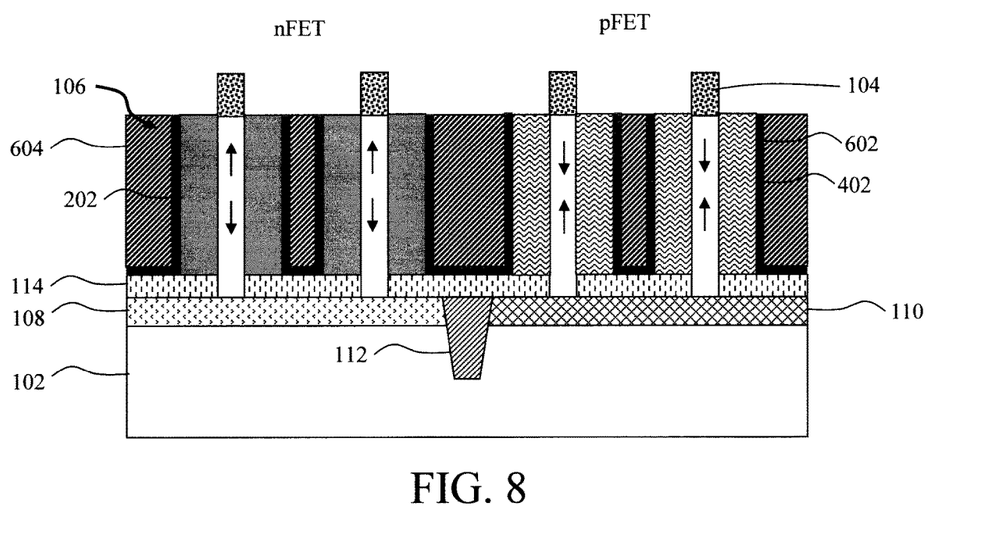
FIG. 8 is a cross-sectional diagram illustrating the rigid fill material and the liner having been recessed to expose the tops of the tensile/compressive dummy stressor materials according to an embodiment of the present invention.

Switching again briefly to a top-down view, FIG. 7 is depiction from viewpoint B—see FIG. 6. To look at it another way, the cross-sectional view provided in FIG. 6 is that of a cut along line B-B' in FIG. 7. Notably, the rigid fill material 604 is present surrounding the fins 106, and is in direct physical contact with the ends of the fins 106 (in the fin cut regions—see above) to lock in the stress from the dummy stressor materials 202/402. As will be described in detail below, this permits dummy stressor materials 202/402 to later be removed and replaced with a replacement metal gate without relaxing the channel strain induced by the dummy stressor materials 202/402. Thus, as highlighted above, the dummy stressor materials 202/402 also serve as dummy gates in the present devices.

The rigid fill material 604 and the liner 602 are then recessed to expose the tops of the dummy stressor materials 202/402. See FIG. 8. As provided above, the protective liner 602 can be formed from an oxide material. Thus, by way of example only, recess of the rigid fill material 604 and the protective liner 602 can be accomplished using a nitride-selective etching process such as a nitride-selective RIE to recess the rigid fill material 604 down to the protective liner 602, followed by an oxide-selective etch (such as an oxide-selective wet etch) to clear the protective liner 602.

Recessing the rigid fill material 604 and the protective liner 602 will permit the dummy stressor materials 202/402 (also acting as dummy gates) to be removed and replaced with a replacement metal gate. For instance, beginning arbitrarily with the nFET devices, dummy stressor material 202 is removed selective to rigid fill material 604 and protective liner 602, forming gate trenches 902 in the rigid fill material 604. See FIG. 9. For instance, dummy stressor material 202 can be removed using a self-aligned directional fin RIE again. Since fin hardmask 104 is present, a directional RIE provides the same fin structure without dummy stressor material 202. A wet etch process can also be used to selectively remove a SiGe or III-V material against an Si fin.

Figure 9:
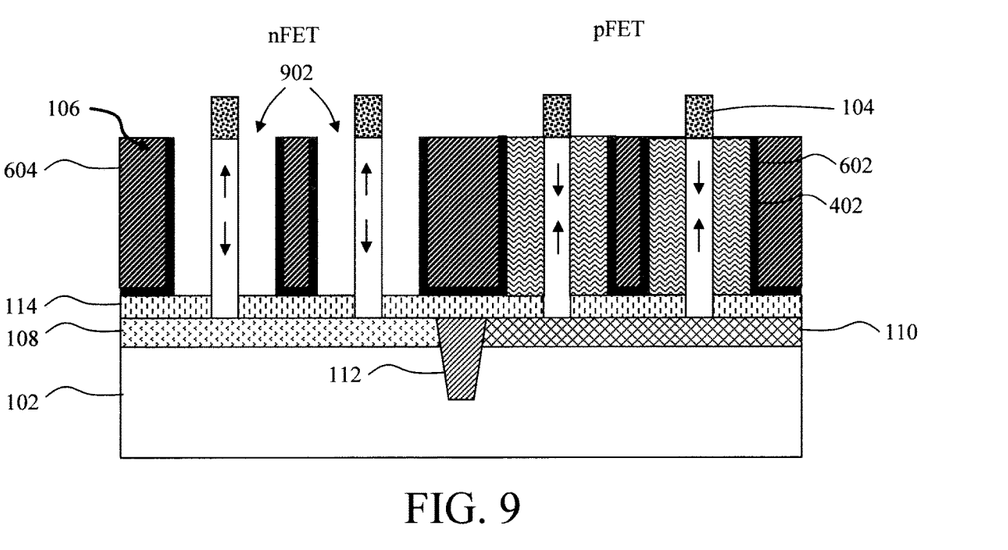
FIG. 9 is a cross-sectional diagram illustrating the tensile dummy stressor material having been removed selective to rigid fill material and liner in the nFET devices, forming nFET gate trenches in the rigid fill material according to an embodiment of the present invention.

Liner 602 protects the underlying fins 106 during the removal of dummy stressor material 202. After removal of dummy stressor material 202, the liner 602 can be removed from the gate trenches 902 (including from the sidewalls of the fins 106) using an oxide-selective etch (such as an oxide-selective wet etch). As highlighted above, the rigid fill material 604 remains in contact with the ends of the fins 106 and serves to maintain strain in the fins 106 after removal of the dummy stressor material 202.

Replacement gate stacks (i.e., a gate dielectric and a gate conductor) are then formed in the gate trenches 902 surrounding each of the nFET fins 106. See FIG. 10. To form the (nFET) replacement gate stacks, an interfacial oxide 1002 is first formed on exposed (sidewall) surfaces of the nFET fins 106 by an oxidation process to a thickness for example of from about 0.3 nanometers (nm) to about 5 nm, and ranges therebetween, e.g., about 1 nm. A gate dielectric 1004 is then deposited into the gate trenches 902 over the interfacial oxide 1002 and bottom spacers 114. Preferably, a conformal deposition process such as CVD or ALD is used such that the gate dielectric 1004 lines the gate trenches 902. A gate conductor 1006 is then deposited into the gate trenches 902 over the gate dielectric 1004, e.g., using a process such as CVD, ALD, electrochemical plating, etc.

Figure 10:
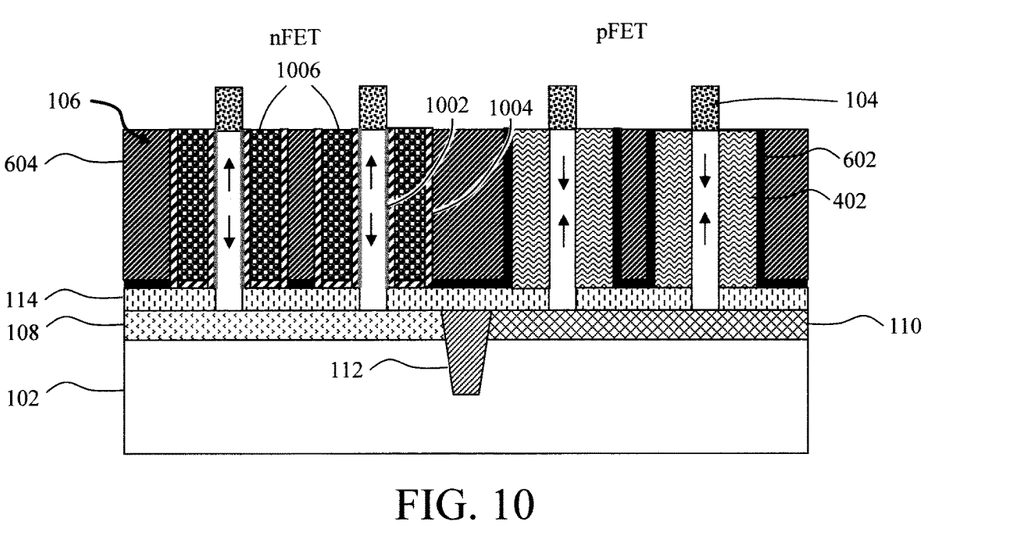
FIG. 10 is a cross-sectional diagram illustrating replacement gate stacks having been formed in the nFET gate trenches surrounding each of the nFET fins according to an embodiment of the present invention.

According to an exemplary embodiment, the gate conductor 1006 is an n-type workfunction setting metal(s) and the gate dielectric 1004 is a high-κ dielectric. Suitable n-type workfunction setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC).

The term "high-κ" as used herein refers to a material having a relative dielectric constant κ which is much higher than that of silicon dioxide (e.g., a dielectric constant κ=25 for hafnium oxide ($HfO_2$) rather than 3.9 for $SiO_2$). Suitable high-κ gate dielectrics include, but are not limited to, $HfO_2$ and/or lanthanum oxide ($La_2O_3$).

Figure 11:
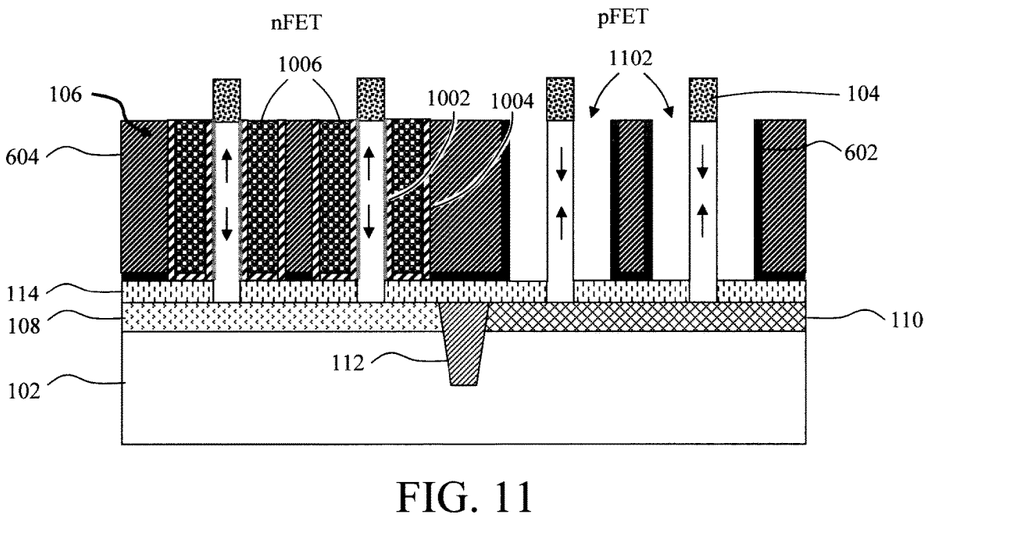
FIG. 11 is a cross-sectional diagram illustrating the compressive dummy stressor material having been removed selective to rigid fill material and liner in the pFET devices, forming pFET gate trenches in the rigid fill material according to an embodiment of the present invention.

The process is then repeated for the pFET devices, where the dummy stressor material 402 is removed and replaced with a metal gate having a p-type workfunction setting metal(s). Namely, as shown in FIG. 11 dummy stressor material 402 is removed selective to rigid fill material 604 and liner 602, forming gate trenches 1102 in the rigid fill material 604. As above, dummy stressor material 402 can be removed using a self-aligned directional fin RIE. Since fin hardmask 104 is present, a directional RIE provides the same fin structure without dummy stressor material 402.

Liner 602 protects the underlying fins 106 during the removal of dummy stressor material 402. After removal of dummy stressor material 402, the liner 602 can be removed from the gate trenches 1102 (including from the sidewalls of the fins 106) using an oxide-selective etch (such as an oxide-selective wet etch). As highlighted above, the rigid fill material 604 remains in contact with the ends of the fins 106 and serves to maintain strain in the fins 106 after removal of the dummy stressor material 402.

Replacement gate stacks (i.e., a gate dielectric and a gate conductor) are then formed in the gate trenches 1102 surrounding each of the pFET fins 106. See FIG. 12. To form the (pFET) replacement gate stacks, an interfacial oxide 1202 is first formed on exposed (sidewall) surfaces of the pFET fins 106 by an oxidation process to a thickness for example of from about 0.3 nm to about 5 nm, and ranges therebetween, e.g., about 1 nm. A gate dielectric 1204 is then deposited into the gate trenches 1102 over the interfacial oxide 1202 and bottom spacers 114. Preferably, a conformal deposition process such as CVD or ALD is used such that the gate dielectric 1204 lines the gate trenches 1102. A gate conductor 1206 is then deposited into the gate trenches 1102 over the gate dielectric 1204, e.g., using a process such as CVD, ALD, electrochemical plating, etc.

Figure 12:
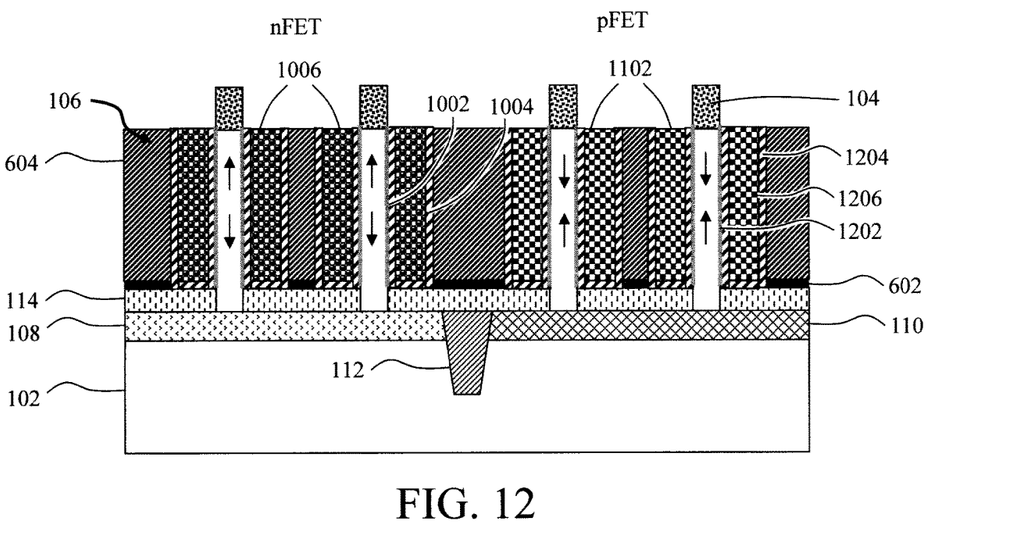
FIG. 12 is a cross-sectional diagram illustrating replacement gate stacks having been formed in the pFET gate trenches surrounding each of the pFET fins according to an embodiment of the present invention.
Figure 13:
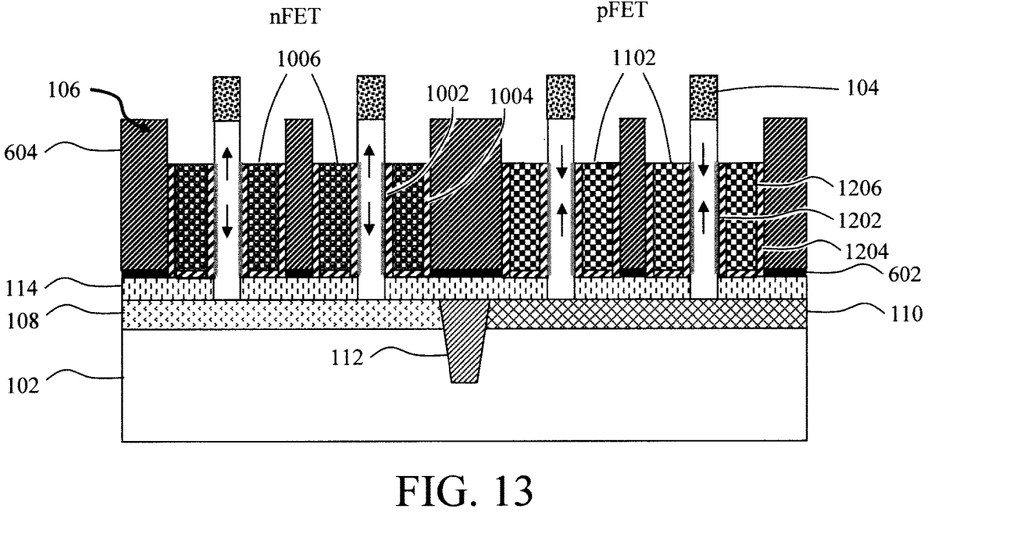
FIG. 13 is a cross-sectional diagram illustrating the replacement gate stacks having been recessed to expose the tops of the fins according to an embodiment of the present invention.

According to an exemplary embodiment, the gate conductor 1206 is a p-type workfunction setting metal(s) and the gate dielectric 1204 is a high-κ dielectric. Suitable p-type p-type workfunction setting metals include, but are not limited to, TiN, TaN, and tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given here and above. As provided above, suitable high-κ gate dielectrics include, but are not limited to, $HfO_2$ and/or $La_2O_3$.

Next, following deposition of the gate stack materials, the replacement gate stacks are recessed to expose the tops of the fins 106. See FIG. 13. This replacement gate recess enables formation of the top spacers and top source and drains at the tops of the fins 106.

Figure 14:
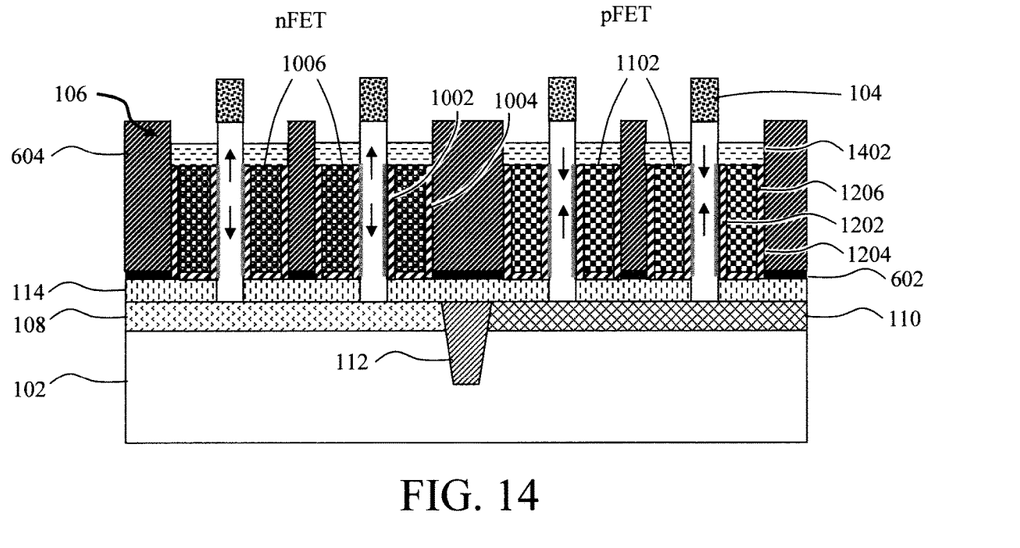
FIG. 14 is a cross-sectional diagram illustrating top spacers having been formed on the gate stacks according to an embodiment of the present invention.
Figure 15:
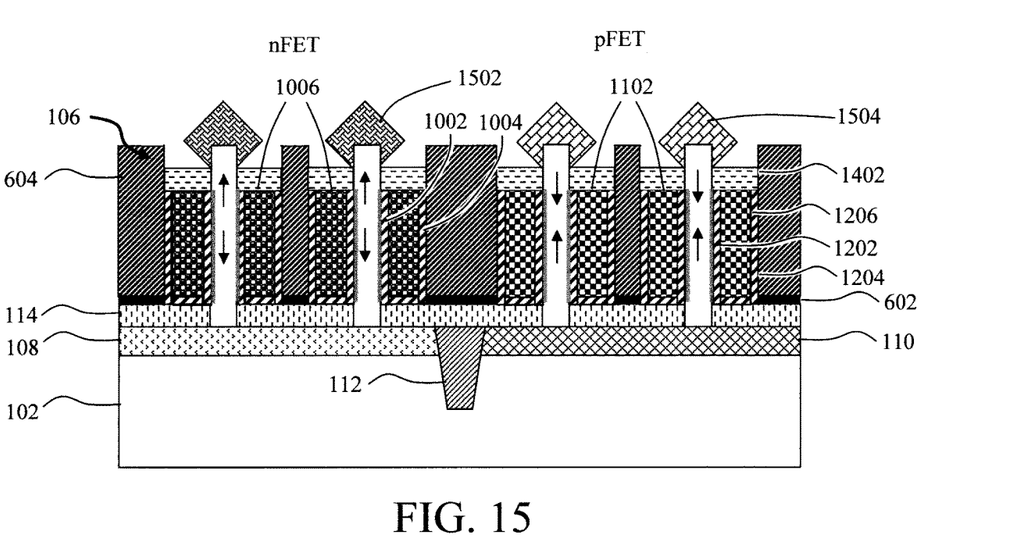
FIG. 15 is a cross-sectional diagram illustrating the fin hardmasks having been removed, and nFET/pFET top source and drains having been formed over the top spacers at the tops of the nFET and pFET fins according to an embodiment of the present invention.

Specifically, as shown in FIG. 14, top spacers 1402 are formed on the gate stacks (using, e.g., a directional deposition process—see above). Suitable materials for the top spacers 1402 include, but are not limited to, oxide spacer materials such as $SiO_2$ and/or SiOC and/or nitride spacer materials such as SiN and/or SiBN. The top spacers 1402 will serve to offset the replacement gate stacks from the top source and drains (see below).

The fin hardmasks 104 are then removed and top source and drains 1502 and 1504 are formed over the top spacers 1402 at the tops of the nFET and pFET fins 106, respectively. See FIG. 15. According to an exemplary embodiment, the top source and drains 1502 and 1504 are formed from an in-situ doped (e.g., during growth) or ex-situ doped (e.g., by ion implantation) epitaxial material. By way of example only, suitable source and drain materials for the nFET top source and drains 1502 include, but are not limited to, Si:P. Suitable materials for the pFET top source and drains 1504 include, but are not limited to, SiGe:B.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A vertical transport field-effect transistor (VTFET) device, comprising:
fins patterned in a wafer;
bottom source and drains at a base of the fins;
bottom spacers on the bottom source and drains;
gate stacks along sidewalls of the fins above the bottom spacers, wherein pre-induced strain is present in the fins;
a rigid fill material fully surrounding the fins and the gate stacks, wherein the rigid fill material preserves the pre-induced strain in the fins;
top spacers on the gate stacks; and
top source and drains over the top spacers at tops of the fins.

2. The VTFET device of claim 1, wherein the fins comprise n-channel FET (nFET) fins and p-channel FET (pFET) fins.

3. The VTFET device of claim 2, and wherein tensile strain is present in the nFET fins and compressive strain is present in the pFET fins.

4. The VTFET device of claim 1, wherein each of the gate stacks comprises:
an interfacial oxide on the sidewalls of the fins;
a gate dielectric disposed over the interfacial oxide; and
a gate conductor disposed on the gate dielectric.

5. The VTFET device of claim 4, wherein the gate dielectric comprises a high-κ gate dielectric selected from the group consisting of: hafnium oxide ($HfO_2$), lanthanum oxide ($La_2O_3$), and combinations thereof.

6. The VTFET device of claim 5, wherein the gate conductor comprises a workfunction setting metal selected from the group consisting of: titanium nitride (TiN), tantalum nitride (TaN), aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W), and combinations thereof.

7. The VTFET device of claim 1, wherein the rigid fill material is selected from the group consisting of: silicon nitride (SiN), silicon oxycarbonitride (SiOCN), and combinations thereof.

8. The VTFET device of claim 1, wherein the rigid fill material surrounding the fins is in contact with ends of the fins.

9. The VTFET device of claim 1, wherein the bottom source and drains and the top source and drains each comprises a material selected from the group consisting of: phosphorous-doped Si (Si:P) and boron-doped SiGe (SiGe:B).

10. The VTFET device of claim 1, wherein the fins comprise silicon (Si).

11. The VTFET device of claim 1, wherein the bottom spacers and the top spacers each comprises a material selected from the group consisting of: silicon dioxide ($SiO_2$), silicon oxycarbide (SiOC), SiN, silicon-boron-nitride (SiBN), and combinations thereof.

12. A VTFET device, comprising:
fins patterned in a wafer;
bottom source and drains at a base of the fins;
bottom spacers on the bottom source and drains;
gate stacks along sidewalls of the fins above the bottom spacers, wherein the fins comprise nFET fins and pFET fins, and wherein pre-induced tensile strain is present in the nFET fins and pre-induced compressive strain is present in the pFET fins;
a rigid fill material fully surrounding the fins and the gate stacks, wherein the rigid fill material preserves the pre-induced tensile strain in the nFET fins and the pre-induced compressive strain in the pFET fins;
top spacers on the gate stacks; and top source and drains over the top spacers at tops of the fins.

13. The VTFET device of claim 12, wherein each of the gate stacks comprises:
an interfacial oxide on the sidewalls of the fins;
a gate dielectric disposed over the interfacial oxide; and
a gate conductor disposed on the gate dielectric.

14. The VTFET device of claim 13, wherein the gate dielectric comprises a high-κ gate dielectric selected from the group consisting of: $HfO_2$, $La_2O_3$, and combinations thereof.

15. The VTFET device of claim 14, wherein the gate conductor comprises a workfunction setting metal selected from the group consisting of: TiN, TaN, Al-containing alloys, TiAl, TiAlN, TiAlC, TaAl, TaAlN, TaAlC, W, and combinations thereof.

16. The VTFET device of claim 12, wherein the rigid fill material is selected from the group consisting of: SiN, SiOCN, and combinations thereof.

17. The VTFET device of claim 12, wherein the rigid fill material surrounding the fins is in contact with ends of the fins.

18. The VTFET device of claim 12, wherein the bottom source and drains and the top source and drains each comprises a material selected from the group consisting of: Si:P and SiGe:B.

19. The VTFET device of claim 12, wherein the fins comprise Si.

20. The VTFET device of claim 12, wherein the bottom spacers and the top spacers each comprises a material selected from the group consisting of: $SiO_2$, SiOC, SiN, SiBN, and combinations thereof.

\* \* \* \* \*